US012805321B2

(12) United States Patent
Wang et al.

(10) Patent No.: US 12,805,321 B2
(45) Date of Patent: Nov. 17, 2026

(54) LEAD BONDING STRUCTURE COMPRISING EMBEDDED MANIFOLD TYPE MICRO-CHANNEL AND PREPARATION METHOD FOR LEAD BONDING STRUCTURE

(71) Applicant: Peking University, Beijing (CN)

(72) Inventors: Wei Wang, Beijing (CN); Yuchi Yang, Beijing (CN); Jianyu Du, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 392 days.

(21) Appl. No.: 18/563,120

(22) PCT Filed: Jun. 1, 2021

(86) PCT No.: PCT/CN2021/097672
§ 371 (c)(1),
(2) Date: Nov. 21, 2023

(87) PCT Pub. No.: WO2022/241846
PCT Pub. Date: Nov. 24, 2022

(65) Prior Publication Data

US 2024/0266254 A1 Aug. 8, 2024

(30) Foreign Application Priority Data

May 21, 2021 (CN) ........................ 202110557332.X

(51) Int. Cl.
*H10W 40/47* (2026.01)
*H10W 70/00* (2026.01)
*H10W 90/00* (2026.01)

(52) U.S. Cl.
CPC ......... *H10W 40/47* (2026.01); *H10W 70/099* (2026.01); *H10W 90/754* (2026.01)

(58) Field of Classification Search
CPC ... H10W 40/22; H10W 40/47; H10W 70/093; H10W 72/50; H10W 74/114; H10W 90/754
See application file for complete search history.

(56) References Cited

U.S. PATENT DOCUMENTS 6,445,591 B1 * 9/2002 Kwong .................. H05K 1/183 361/764
2004/0102028 A1 * 5/2004 Hsieh .................... H10W 70/05 438/611

(Continued)

FOREIGN PATENT DOCUMENTS

CN 108735693 A 11/2018
CN 108766897 A 11/2018

(Continued)

OTHER PUBLICATIONS

International Search Report dated Feb. 17, 2022 received in International Application No. PCT/CN2021/097672.

(Continued)

*Primary Examiner* — Britt Hanley
*Assistant Examiner* — Kevin Quinto
(74) *Attorney, Agent, or Firm* — Scully, Scott, Murphy & Presser, P.C.

(57) ABSTRACT

The present invention relates to a wire bonding structure with an embedded manifold type micro-channel. The wire bonding structure includes: a chip, including a substrate and an embedded micro-channel located on a back portion of the substrate; an interposer, including a manifold channel, a liquid inlet, and a liquid outlet; a low-temperature sealing layer, configured to hermetically communicate the embedded micro-channel with the manifold channel, wherein the low-temperature sealing layer is located between the chip and the interposer; and a bonding wire, configured to electrically connect the chip to the interposer. The present (Continued)

invention further relates to a preparation method of a wire bonding structure with an embedded manifold type micro-channel. The wire bonding structure of the present invention has both low-temperature process compatibility and packaging compatibility, and further has high heat dissipation efficiency. The embedded manifold type micro-channel of the present invention has the advantages of short flow distance, low flow resistance, and low thermal resistance, and is more suitable for being integrated into a high-power chip for efficient heat dissipation.

12 Claims, 3 Drawing Sheets

(56) References Cited

U.S. PATENT DOCUMENTS

2005/0151244 A1* 7/2005 Chrysler ............... H10W 40/47
257/713
2006/0115931 A1* 6/2006 Hsu ..................... H10W 70/614
257/E23.178
2017/0283255 A1* 10/2017 Ehmke ..................... C25D 5/12

FOREIGN PATENT DOCUMENTS

CN 109524373 A 3/2019
CN 109560054 A 4/2019
CN 110164835 A 8/2019
CN 110425914 A 11/2019
CN 209896047 U 1/2020
CN 111446221 A 7/2020
CN 111769087 A * 10/2020 ....... H01L 21/76895
CN 112750600 A 5/2021

OTHER PUBLICATIONS

First Office Action dated Sep. 27, 2021 received in Chinese Patent Application No. 202110557332.X.

* cited by examiner

LEAD BONDING STRUCTURE COMPRISING EMBEDDED MANIFOLD TYPE MICRO-CHANNEL AND PREPARATION METHOD FOR LEAD BONDING STRUCTURE

TECHNICAL FIELD

The present invention relates to the field of chip heat dissipation, and in particular, to a wire bonding structure with an embedded manifold type micro-channel and a preparation method thereof.

BACKGROUND ART

With the increase in integration level and power consumption of a modern electronic chip and the decrease in feature size of the modern electronic chip, a rapid increase in chip system heating has become a major challenge in the development and application of advanced electronic chip systems. Liquid cooling is a technology that uses liquid to cool high-heating-power modules in electronic devices. It is used for chip modules with high thermal design power and is mainly used for cooling high-power chips. As liquid has a larger specific heat capacity than gas, and liquid usually has a larger convective heat transfer coefficient during relative motion to a surface of a solid, the liquid cooling can achieve lower thermal resistance between transistors and environment. The liquid cooling can be divided into non-embedded liquid cooling and embedded liquid cooling according to ways of being integrated with a chip. The non-embedded liquid cooling refers to mounting a metal block with a liquid path inside to a heating chip through a high-thermal-conductivity material, and enabling a low-temperature working medium to flow into the metal block to take away heat generated by the chip. The embedded liquid cooling is a cooling technology that uses a cooling working medium to directly flush a surface (or a back) of a chip. In the embedded liquid cooling technology, generally, a micro-channel is processed on the back of the chip, and the cooling medium flushes a fin when flowing through the micro-channel to take away heat transferred by a transistor to a surface of the fin.

In the non-embedded liquid cooling heat dissipation technology, due to use of thermally conductive silicone grease or another bonding material between the metal block and the chip, and even use of a sealing cover, there are a plurality of material interfaces that introduce thermal boundary resistance for multiple times. This affects the heat dissipation efficiency. On the other hand, as the integration degree of transistors in a chip increases, the thermal resistance to transferring of heat generated by high-power transistors to the surface (or the back) of the chip through a multi-layer structure inside the chip is also increasing (the internal thermal resistance increases), but the non-embedded cooling can only reduce the external thermal resistance. Therefore, as the complexity and integration degree of the transistors increase, the heat dissipation efficiency of the non-embedded liquid cooling gradually decreases.

The embedded liquid cooling heat dissipation technology takes away heat by a cooling working medium directly flowing through a micro-channel embedded into the chip, so that there is no thermal boundary resistance, and the embedded cooling is more efficient and is suitable for heat dissipation of high-power chips. A liquid cooling heat dissipation channel is usually designed to be a pin fin structure or a radial flow division structure, which has the disadvantages of high flow resistance and large temperature rise of a cooling medium.

However, in a process of processing and preparing an embedded cooling channel, after etching of heat dissipation fins of a back cavity is completed, the heat dissipation fins need to be bonded and sealed with a cover plate to achieve a micro-channel structure. Traditional bonding methods such as silicon-glass anodic bonding or silicon-silicon direct bonding require a high voltage or temperature, and an integrated circuit (IC) device may have an electrical failure under this bonding condition. Therefore, the traditional embedded cooling technology is not compatible with an IC.

Therefore, there is an urgent need to develop a packaging structure that has both low-temperature process compatibility and packaging compatibility and has high heat dissipation efficiency.

SUMMARY OF THE INVENTION

The present invention aims to overcome the shortcomings in the prior art and provide a wire bonding structure with an embedded manifold type micro-channel. The wire bonding structure has both low-temperature process compatibility and packaging compatibility, and has high heat dissipation efficiency. The manifold type micro-channel has the advantages of short flow distance, low flow resistance, and low thermal resistance, and is more suitable for being integrated into a high-power chip for efficient heat dissipation.

The present invention further aims to provide a preparation method of a wire bonding structure with an embedded manifold type micro-channel.

To achieve the above objectives, the present invention provides the following technical solutions.

A wire bonding structure with an embedded manifold type micro-channel includes:

- a chip, including a substrate and an embedded micro-channel located on a back portion of the substrate;
- an interposer, including a manifold channel, a liquid inlet, and a liquid outlet;
- a low-temperature sealing layer, configured to hermetically communicate the embedded micro-channel with the manifold channel, wherein the low-temperature sealing layer is located between the chip and the interposer; and
- a bonding wire, configured to electrically connect the chip to the interposer.

A preparation method of a wire bonding structure with an embedded manifold type micro-channel includes:

- providing a chip, and manufacturing an embedded micro-channel on a back portion of a substrate of the chip;
- preparing an interposer with a manifold channel, a liquid inlet, and a liquid outlet;
- forming a low-temperature sealing layer between the chip and the interposer to hermetically communicate the embedded micro-channel with the manifold channel; and
- connecting the chip with the interposer through a bonding wire to achieve electrical connection therebetween.

Compared with the prior art, the present invention achieves the following technical effects:

1. On the basis of liquid cooling heat dissipation of an embedded micro-fluid, the heat dissipation technology of the present invention dissipates heat of the chip through a fluid in a channel structure embedded into a back cavity of the chip. Compared with other non-embedded heat dissipation measures, this technology avoids the thermal conductivity resistance of materials inside a packaging body and the thermal boundary resistance between different materials, so that the heat dissipation efficiency is higher. The technology can greatly reduce a temperature rise of a high-power chip, ensure stable operation of the chip in a high-performance mode, and prolong the service life of the chip.

2. The heat dissipation technology of the present invention has electrical compatibility, and a heat dissipation chip among application objects is general. Whether it is a radio frequency power chip or a logic digital chip, the chip can be cooled using this technology as long as the back of the chip is etched to form an embedded micro-channel to bonding with a specific manifold channel. This technology is a universal and efficient cooling method for all chips with high thermal design power values.
3. The heat dissipation technology of the present invention involves a simple preparation process. A target chip only needs to be etched to form a heat dissipation micro-channel to be bonded with the manifold channel of the interposer. Metal thin films can also be prepared on two bonding surfaces separately, and IC-compatible low-temperature eutectic bonding is used to achieve channel sealing. The present invention does not require integration of large metal heat dissipation fins, heat dissipation fans, or cooling plates, which can significantly reduce the volume of the heat dissipation system and increase the integration degree of a packaging structure.
4. The heat dissipation technology of the present invention has highly flexibility. After the back cavity of the high-power chip is etched to form the heat dissipation micro-channel, the chip can not only be bonded with a manifold channel base plate made of a high-performance material such as LTCC, but also be bonded with a manifold channel base plate made of a low-value material such as PCB, making it highly compatible in the market. In addition, the surface-mounting bonding method is also flexible. An epoxy resin or thermoplastic material can be used for binding, or different metal solders can be used according to an actual situation for eutectic welding.

BRIEF DESCRIPTION OF THE DRAWINGS

Various other advantages and benefits will become apparent to those of ordinary skill in the art upon reading the following detailed description of the preferred implementations. The accompanying drawings are only for the purpose of illustrating preferred implementations and are not considered as a limitation on the present invention. Furthermore, the same components are denoted by the same reference numerals throughout the drawings. In the drawings.

DESCRIPTIONS OF REFERENCE NUMERALS

Figure 1:
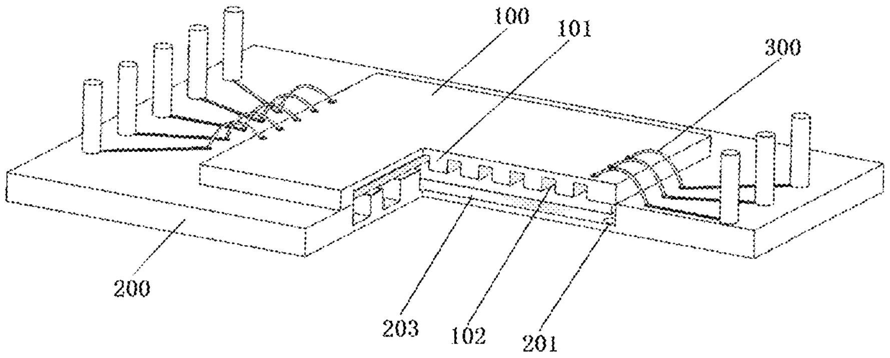
FIG. 1 shows a schematic diagram of a wire bonding structure with an embedded manifold type micro-channel according to the present invention.

100: chip; 101: substrate; 102: embedded micro-channel; 200: interposer; 201: liquid inlet; 202: liquid outlet; 203: manifold channel; 204: inflow channel; 205: outflow channel; 300: bonding wire; 400: packaging housing; and 500: fluid I/O port.

DETAILED DESCRIPTION OF THE INVENTION

The embodiments of the present disclosure will be described below with reference to the accompanying drawings. However, it should be understood that these descriptions are only illustrative and not intended to limit the scope of the present disclosure. In addition, in the following explanation, descriptions of well-known structures and techniques have been omitted to avoid unnecessary confusion with the concepts of the present disclosure.

Various schematic structural diagrams according to the embodiments of the present disclosure are shown in the accompanying drawings. These drawings are not drawn to scale. For the purpose of clarity, some details have been enlarged, and some details may possibly have been omitted. Shapes of various regions and layers shown in the drawings, as well as their relative sizes and positional relationships, are only exemplary. In practice, there may be deviations due to manufacturing tolerances or technical limitations. In addition, a person skilled in the art can additionally design regions/layers with different shapes, sizes, and relative positions according to actual needs.

In the context of the present disclosure, when a layer/component is referred to as being located "above" another layer/component, the layer/component can be directly located on the another layer/component, or there can be an intermediate layer/component between them. In addition, if a layer/component is located "above" another layer/component in a certain orientation, when the orientation is reversed, the layer/component can be located "below" the another layer/component.

Figure 2:
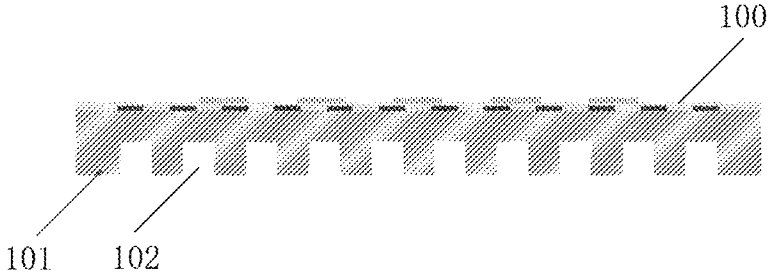
FIG. 2 shows a longitudinal sectional view of a chip with an embedded micro-channel.
Figure 3:
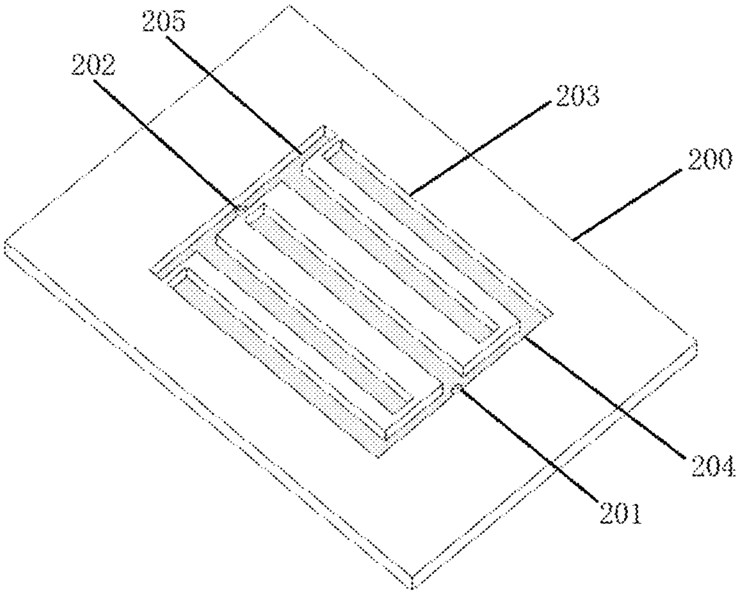
FIG. 3 shows a sectional top view of an interposer with a manifold channel.

The present invention will be further explained below in conjunction with the specific accompanying drawings:

In a specific embodiment, as shown in FIG. 1 to FIG. 3, FIG. 1 shows a schematic diagram of a wire bonding structure with an embedded manifold type micro-channel according to the present invention; FIG. 2 shows a longitudinal sectional view of a chip with an embedded micro-channel; and FIG. 3 shows a sectional top view of an interposer with a manifold channel. Specifically, as shown in FIG. 1, a wire bonding structure with an embedded manifold type micro-channel according to the present invention includes: a chip 100, including a substrate 101 and an embedded micro-channel 102 located on a back portion of the substrate 101; an interposer 200, including a liquid inlet 201, a liquid outlet 202 (not shown), and a manifold channel 203; a low-temperature sealing layer (not shown), configured to hermetically communicate the embedded micro-channel 102 with the manifold channel 203, wherein the low-temperature sealing layer is located between the chip 100 and the interposer 200; and a bonding wire 300, configured to electrically connect the chip 100 to the interposer 200.

It can be seen from FIG. 1 that the embedded micro-channel 102 is located right above the manifold channel 203.

Specifically, FIG. 2 shows a longitudinal sectional view of the chip 100, wherein a plurality of embedded micro-channels 102 are arranged on the back portion of the substrate 101, and these embedded micro-channels are parallel to each other and are disconnected from each other. Factors considered during selection of parameters such as a length, a width, a height, and a spacing for the embedded micro-channels include: if the length is too long, it will increase flow resistance; if the width is too narrow, it will seriously increase flow resistance; when the height is too small, heat cannot be fully dissipated through channels; and when the height of the flow channel is too high, the heat transfer efficiency will be affected because of a decrease in the efficiency of fins. These factors are not conductive to heat dissipation. In order to achieve the optimal heat dissipation performance, suitable parameters can be selected through simulation and optimization of the various parameters. Usually, each embedded micro-channel has a length of approximately 0.5-5 mm and a width of approximately 50-200 μm. A depth-to-width ratio is approximately 6:1 to 1:1. The substrate 101 can be a conventional substrate in the art, including but not limited to a silicon substrate, a silicon carbide substrate, a silicon germanium substrate, a gallium arsenide substrate, and the like. The chip of the present invention is general. Whether it is a radio frequency power chip or a logic digital chip, the chip can bond with a specific manifold channel after the back of the chip is etched to form an embedded micro-channel.

FIG. 3 shows a sectional top view of the interposer 200. It can be seen from FIG. 3 that the manifold channel 203 includes an inflow channel 204 and an outflow channel 205. The inflow channel 204 includes a main inflow channel and a plurality of branch inflow channels, and the main inflow channel is connected to the liquid inlet 201. The outflow channel 205 includes a main outflow channel and a plurality of branch outflow channels, and the main outflow channel is connected to the liquid outlet 202. The inflow channel 204 and the outflow channel 205 are both in a shape of comb teeth. One end of each branch inflow channel is connected with the main inflow channel, and the other end is closed. One end of each branch outflow channel is connected with the main outflow channel, and the other end is closed. The inflow channel 204 and the outflow channel 205 are arranged in an interdigital manner and are not connected to each other. As shown in FIG. 3, each branch inflow channel and each branch outflow channel are arranged in parallel. A fluid flowing direction in each branch inflow channel or each branch outflow channel forms a vertical or approximately vertical angle to a fluid flowing direction in the embedded micro-channel 102. The interposer shown in FIG. 3 can be a PCB interposer or an LTCC interposer. After a back cavity of a high-power chip is etched to form a heat dissipation micro-channel, the chip can not only be bonded with a manifold channel base plate made of a high-performance material such as LTCC, but also be bonded with a manifold channel base plate made of a low-value material such as PCB, making it highly compatible in the market.

Figure 4:
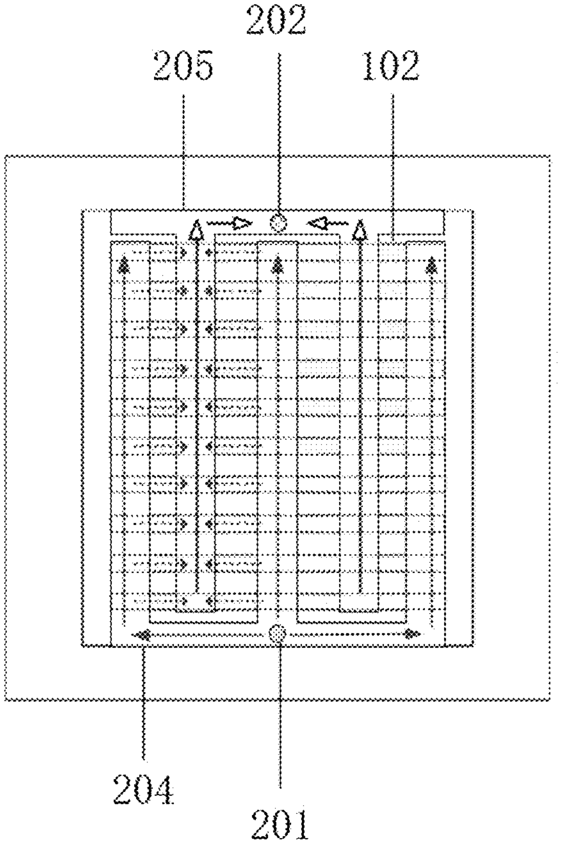
FIG. 4 shows a schematic diagram of a cooling fluid path according to the present invention.

FIG. 4 shows a flowing condition of a cooling fluid in the embedded micro-channel 102, the inflow channel 204, and the outflow channel 205. The cooling fluid flows into the liquid inlet 201 and flows inside the inflow channel 204 along the solid arrow. Since one end, far from the liquid inlet 201, of the inflow channel 204 is closed, the cooling fluid then flows into the embedded micro-channel 102 of the chip along the dashed arrow for heat transfer with a heat source chip, and then flows along the outflow channel 205 according to the hollow arrow. Since one end, far from the liquid outlet 202, of the outflow channel 205 is closed, the cooling fluid finally flows out of the liquid outlet 202, thus completing the entire fluid cooling process. This design allows the cooling fluid flowing through an entire surface of the embedded micro-channel 102 to take away heat generated by the chip, achieving efficient heat dissipation.

The low-temperature sealing layer is located between the chip 100 and the interposer 200. The low-temperature sealing layer is configured to seal a channel to achieve hermetical connection between the embedded micro-channel 102 and the manifold channel 203, thus forming an embedded manifold type micro-channel structure. The low-temperature sealing layer can be a binding agent layer or a metal layer. In some embodiments, the binding agent layer may include a thermosetting material or a thermoplastic material. The thermosetting material can be epoxy resin or polyurethane. The thermoplastic material can be polyvinyl acetate or polyvinyl acetal. The metal layer can be obtained by combining any one of a Physical Vapor Deposition (PVD) process, a Chemical Vapor Deposition (CVD) process, and an electroplating process with a low-temperature eutectic bonding process. The metal layer can include one or more metal materials selected from Cu, Sn, Pb, In, Au, Ag, and Sb. For a small-sized channel or a batch manufacturing occasion, the metal layer obtained by combining any one of the PVD process, the CVD process, and the electroplating process with the low-temperature eutectic bonding process is more suitable than the binding agent layer. In the present invention, a low temperature refers to a temperature below 300° C.

The cooling fluid used in conjunction with the aforementioned embedded manifold type micro-channel structure can be deionized water or a specialized coolant with a low boiling point (such as 40° C.-80° ° C.), so that the cooling process is phase change cooling, the heat dissipation capacity is improved, and the temperature uniformity is improved.

Compared with other non-embedded heat dissipation measures, the embedded manifold type micro-channel structure of the present invention avoids the thermal conductivity resistance of materials inside a packaging body and the thermal boundary resistance between different materials, so that the heat dissipation efficiency is higher. A temperature rise of the high-power chip is greatly reduced; stable operation of the chip in a high-performance mode is ensured; and the service life of the chip is prolonged.

FIG. 1 shows the bonding wire 300. There are no special restrictions on a material of the bonding wire 300, as long as it can achieve the electrical connection between the chip 100 and the interposer 200. Preferably, the bonding wire 300 can be a gold wire, an aluminum wire, a copper wire, or the like.

In a specific embodiment, the present invention provides a preparation method of a wire bonding structure with an embedded manifold type micro-channel, including the following steps.

A chip 100 is provided. The chip 100 can be in a wafer state or a die state.

In a case that the chip 100 is in the wafer state, before an embedded micro-channel 102 is manufactured, a wafer thickness of the chip 100 is first reduced, for example, the wafer thickness is reduced to 300-500 μm, preferably to 350-450 μm. This thickness requirement ensures that a silicon wafer can still maintain reliable strength even after the embedded micro-channel for heat dissipation is formed by etching a back cavity. Then, the embedded micro-channel 102 is manufactured on a back portion of a substrate 101 of the chip 100 by combining a wafer lithography process with a wafer etching process. The etching process includes conventional wet etching and dry etching, and the dry etching can include ion milling etching, plasma etching, and deep reactive ion etching. In a specific embodiment of the present invention, an embedded micro-channel 102 is manufactured on a substrate 101 of the chip 100 by combining a wafer lithography process and a wafer deep reactive ion etching process. Afterwards, the obtained chip is subjected to wafer dicing and intermediate testing to select a known good die (KGD). The present invention does not have special restrictions on a geometric size of the embedded micro-channel 102. The geometric size of the embedded micro-channel 102 can be collaboratively designed according to flow resistance and thermal resistance.

In a case that the chip 100 is in the die state, the embedded micro-channel 102 can be manufactured by combining a hard mask with an etching process or by combining a lithography process with an etching process. The etching process here includes conventional wet etching and dry etching, and the dry etching can include ion milling etching, plasma etching, and deep reactive ion etching.

An interposer of the present invention can be a PCB interposer or an LTCC interposer. Due to the fact that the two kinds of interposers are laminated boards, a step of preparing an interposer with a manifold channel, a liquid inlet, and a liquid outlet includes: performing secondary machining on the PCB interposer or the LTCC interposer in a machining manner. For example, a manifold channel 203 is manufactured in some layer structures configured to form the PCB interposer or the LTCC interposer, and a liquid inlet 201 and a liquid outlet 202 are manufactured in all the layer structures; and all the obtained layer structures are laminated to obtain an interposer with a manifold channel. The method for manufacturing the manifold channel 203, the liquid inlet 201, and the liquid outlet 202 in the present invention can be a conventional machining method in the art, such as a milling cutter machining process, a drilling process, a lithography process, an etching process, and a corrosion process. In a specific embodiment, a manifold channel 203 can be manufactured in some layer structures by the milling cutter machining process, and a liquid inlet 201 and a liquid outlet 202 can be manufactured in all the layer structures by the conventional drilling process. After lamination, an interposer with a manifold channel can be obtained. For a specific structure of the obtained manifold channel 203, the manifold channel 203 includes an inflow channel 204 and an outflow channel 205. The inflow channel 204 includes a main inflow channel and a plurality of branch inflow channels, and the main inflow channel is connected to the liquid inlet 201. The outflow channel 205 includes a main outflow channel and a plurality of branch outflow channels, and the main outflow channel is connected to the liquid outlet 202. The inflow channel 204 and the outflow channel 205 are both in a shape of comb teeth. One end of each branch inflow channel is connected with the main inflow channel, and the other end is closed. One end of each branch outflow channel is connected with the main outflow channel, and the other end is closed. The inflow channel 204 and the outflow channel 205 are arranged in an interdigital manner and are not connected to each other. As shown in FIG. 3, each branch inflow channel and each branch outflow channel are arranged in parallel. A fluid flowing direction in each branch inflow channel or each branch outflow channel forms a vertical or approximately vertical angle to a fluid flowing direction in the embedded micro-channel 102. The interposer shown in FIG. 3 can be a PCB interposer or an LTCC interposer.

After the chip 100 with the embedded micro-channel 102 and the interposer 200 with the manifold channel 203 have been manufactured, the embedded micro-channel 102 of the chip 100 is aligned with the manifold channel 203 of the interposer 200. A fluid flowing direction in each branch inflow channel or each branch outflow channel forms a vertical or approximately vertical angle to a fluid flowing direction in the embedded micro-channel 102.

Afterwards, a low-temperature sealing layer is formed between the chip 100 and the interposer 200 to achieve channel sealing, so that the embedded micro-channel 102 is hermetically connected with the inflow channel 204 and the outflow channel 205.

A forming method of the low-temperature sealing layer includes: forming the low-temperature sealing layer by curing a binding agent. The low-temperature sealing layer is a binding agent layer formed by using a thermosetting or thermoplastic material. Preferably, the thermosetting material is epoxy resin or polyurethane, and the thermoplastic material is polyvinyl acetate or polyvinyl acetal.

The forming method of the low-temperature sealing layer includes: forming the low-temperature sealing layer using a metal material by way of combining any one of a physical vapor deposition process, a chemical vapor deposition process, and an electroplating process with a low-temperature eutectic bonding process. Preferably, the metal material is one or more of Cu, Sn, Pb, In, Au, Ag, and Sb.

A thickness of the binding agent layer and a mounting pressure can be designed according to a size of the embedded micro-channel of the chip. If the size of the embedded micro-channel is small, the thickness of the binding agent layer and the mounting pressure should not be too large, otherwise, it will cause serious binding agent overflow to block the channel. In addition, a curing temperature determines curing strength. Therefore, if high bonding strength is required, the curing temperature can be appropriately increased to prolong curing time.

For a small-sized embedded micro-channel or a batch manufacturing occasion, the low-temperature eutectic bonding is more suitable than a low-temperature cured binding agent for bonding. Preferably, the low-temperature eutectic bonding can include Cu/Sn eutectic bonding, Pb/Sn eutectic bonding, and Pb/In eutectic bonding. A bonding temperature of the low-temperature eutectic bonding process is below 300° C., and a bonding pressure depends on an area of a bonding interface. Before the low-temperature eutectic bonding step, eutectic solders need to be prepared on two bonding surfaces separately. A solder on the back of the chip with the embedded micro-channel can be directly prepared using a PVD or CVD process, or a binding layer and a seed layer can be first prepared on the back of the chip before the embedded micro-channel is manufactured, and the solder can be prepared on the seed layer by an electroplating process after the embedded micro-channel is manufactured. The binding layer and the seed layer can be prepared using the PVD process. The solder on the interposer side can be prepared using the electroplating process.

Finally, the chip 100 is connected to the interposer 200 through a bonding wire 300 to achieve electrical connection therebetween, thus obtaining the structure shown in FIG. 1. There are no special restrictions on a material of the bonding wire 300, as long as it can achieve the electrical connection between the chip 100 and the interposer 200. The bonding wire 300 can be a gold wire, an aluminum wire, a copper wire, or the like.

It can be seen from the above that the preparation process of the present invention is simple. A target chip only needs to be etched to form a heat dissipation micro-channel to be bonded with the manifold channel of the interposer. Metal thin films can also be prepared on two bonding surfaces separately, and IC-compatible low-temperature eutectic bonding is used to achieve channel sealing. The present invention does not require integration of large metal heat dissipation fins, heat dissipation fans, or cooling plates, which can significantly reduce the volume of the heat dissipation system and increase the integration degree of a packaging structure.

The present invention will be further explained below in conjunction with two specific embodiments, but the present invention is not limited thereto.

Embodiment 1

Firstly, a wafer-state chip 100 with a device layer and an electrical I/O PAD is provided. Then, a back cavity of the chip is etched to form an embedded micro-channel 102 by a conventional wafer lithography process and a wafer etching process. After wafer dicing and intermediate testing, a KGD is selected to obtain the chip structure as shown in FIG. 2.

An inflow channel 204 and an outflow channel 205 are manufactured in some structures configured to form a PCB interposer by a conventional milling cutter machining process, and a liquid inlet 201 and a liquid outlet 202 are manufactured in all layer structures by a conventional drilling process. Then, an electrical interconnection wire is manufactured on a circuit layer configured to form the PCB interposer; and an electrical PAD structure is manufactured at one end, and a pin header is manufactured at the other end. Finally, after the respective obtained layer structures are laminated, the interposer structure with the manifold channel as shown in FIG. 3 can be obtained.

A low-temperature cured epoxy resin binding agent with an appropriate thickness is applied or dipped to the back of the chip structure as shown in FIG. 2; after the embedded micro-channel portion is aligned with the manifold channel portion of the interposer structure as shown in FIG. 3 (so that, a fluid flowing direction in each branch inflow channel or each branch outflow channel forms a vertical or approximately vertical angle to a fluid flowing direction in the embedded micro-channel 102), the interposer structure is mounted on the surface of the chip structure; and after curing, hermetical bonding of the channel is achieved.

The electrical I/O PAD of the obtained chip structure is bonded to the electrical PAD of the obtained interposer structure through a wire 300 to achieve electrical interconnection between the chip and the PCB interposer, thus obtaining the structure as shown in FIG. 1.

Figure 5:
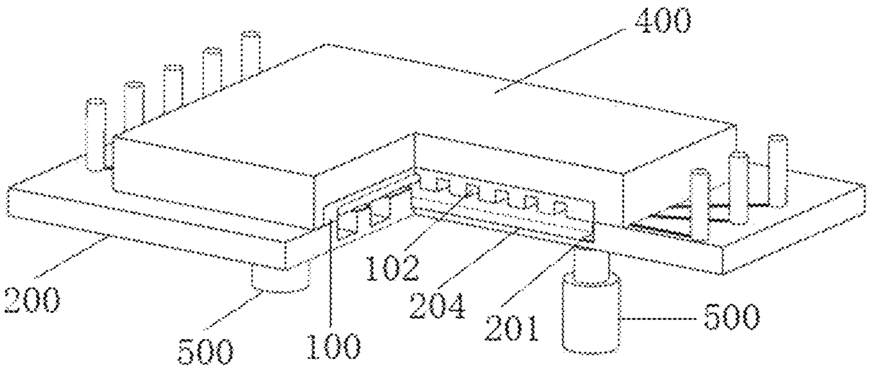
FIG. 5 is a schematic diagram of a wire bonding structure with an embedded manifold type micro-channel prepared in Embodiment 1 and Embodiment 2.

The structure as shown in FIG. 1 is packaged with a packaging housing 400, and an electrical I/O signal is exported through the pin header. Finally, a fluid I/O port 500 is mounted at the liquid inlet 201 and the liquid outlet 202 of the interposer to achieve an electrical I/O and fluid I/O integrated embedded manifold channel cooling technology, thus obtaining a structure as shown in FIG. 5.

A flowing condition of a cooling fluid is as shown in FIG. 4. The cooling fluid flows into the liquid inlet 201 and flows inside the inflow channel 204 along the solid arrow. Afterwards, the cooling fluid flows into the embedded micro-channel 102 of the chip along the dashed arrow for heat transfer with the heat source chip 100, and then flows along the outflow channel 205 according to the hollow arrow. Finally, the cooling fluid flows out of the liquid outlet 202, thus completing the entire fluid cooling process.

Embodiment 2

According to the method described in Embodiment 1, a difference is as follows: Firstly, a wafer-state chip 100 with a device layer and an electrical I/O PAD is provided. Then, Ti/Cu 100/300 nm is prepared by a PVD process on a back of the chip 100 and is used as a binding layer and a seed layer, respectively. Afterwards, a back cavity of the chip is etched to form an embedded micro-channel 102 using a conventional wafer lithography process and a wafer etching process. After a photoresist is removed, Cu/Sn 6/2 μm is electroplated on the seed layer, so that a chip structure with a solder and the embedded micro-channel 102 is obtained. After wafer dicing, intermediate testing is performed to select a KGD. An order of PVD+ etching+ electroplating can ensure that there are no metals inside the micro-channel, which reduces the impact on flowing. Then, a Cu layer with a thickness of approximately 6 μm is prepared at a bonding interface of the obtained interposer structure with the manifold channel by an electroplating process, so that an interposer structure with a solder is obtained. Finally, after the embedded micro-channel region of the chip structure with the solder is aligned with the manifold channel region of the interposer structure with the solder (a fluid flowing direction in each branch inflow channel or each branch outflow channel forms a vertical or approximately vertical angle to a fluid flowing direction in the embedded micro-channel 102), eutectic bonding is performed at a certain bonding pressure and a bonding temperature of approximately 240° C. to achieve hermetical sealing of the channel.

The foregoing descriptions are merely preferred specific implementations of the present invention, but are not intended to limit the protection scope of the present invention. Any variation or replacement easily figured out by a person skilled in the art within the technical scope disclosed in the present invention shall fall within the protection scope of the present invention. Therefore, the protection scope of the present invention shall be subject to the protection scope of the claims.

The invention claimed is:

1. A wire bonding structure with an embedded manifold type micro-channel, wherein the wire bonding structure comprises:

a chip, comprising a substrate and a plurality of embedded micro-channels located on a back portion of the substrate, the plurality of embedded micro-channels being arranged parallel to each other and being disconnected from each other;

an interposer, comprising a manifold channel, a liquid inlet, and a liquid outlet, the manifold channel comprising an inflow channel and an outflow channel arranged in an interdigital manner, the inflow channel and the outflow channel being disconnected from each other;

a low-temperature sealing layer, configured to hermetically communicate the plurality of embedded micro-channels with the manifold channel, wherein the low-temperature sealing layer is located between the chip and the interposer; and a bonding wire, configured to electrically connect the chip to the interposer, wherein a flow direction in each of the inflow channel and the outflow channel is perpendicular to a flow direction in each of the plurality of embedded micro-channels.

2. The wire bonding structure according to claim 1, wherein the interposer is a Printed Circuit Board (PCB) interposer or a Low Temperature Co-Fired Ceramic (LTCC) interposer.

3. The wire bonding structure according to claim 1, wherein:

each of the inflow channel and the outflow channel comprises a main channel and a plurality of branch channels, and one end of each of the plurality of branch channels is closed.

4. The wire bonding structure according to claim 3, wherein the inflow channel and the outflow channel are both in a shape of comb teeth.

5. The wire bonding structure according to claim 1, wherein the low-temperature sealing layer is a binding agent layer or a metal layer.

6. The wire bonding structure according to claim 5, wherein the metal layer comprises one or more metal materials selected from Cu, Sn, Pb, In, Au, Ag, and Sb; and the metal layer is obtained by combining any one of a physical vapor deposition process, a chemical vapor deposition process, and an electroplating process with a low-temperature eutectic bonding process.

7. A preparation method of a wire bonding structure with an embedded manifold type micro-channel, comprising:

providing a chip, and manufacturing a plurality of embedded micro-channels on a back portion of a substrate of the chip, the plurality of embedded micro-channels being arranged parallel to each other and being disconnected from each other;

preparing an interposer with a manifold channel, a liquid inlet, and a liquid outlet, the manifold channel comprising an inflow channel and an outflow channel arranged in an interdigital manner, the inflow channel and the outflow channel being disconnected from each other;

forming a low-temperature sealing layer between the chip and the interposer to hermetically communicate the plurality of embedded micro-channels with the manifold channel; and connecting the chip with the interposer through a bonding wire to achieve electrical connection therebetween, wherein a flow direction in each of the inflow channel and the outflow channel is perpendicular to a flow direction in each of the plurality of embedded micro-channels.

8. The preparation method according to claim 7, wherein the chip is in a wafer state or a die state.

9. The preparation method according to claim 7, wherein the interposer is a PCB interposer or an LTCC interposer; and the step of preparing an interposer with a manifold channel, a liquid inlet, and a liquid outlet comprises: performing secondary machining on the PCB interposer or the LTCC interposer in a machining manner.

10. The preparation method according to claim 7, wherein a forming method of the low-temperature sealing layer comprises: forming the low-temperature sealing layer by curing a binding agent.

11. The preparation method according to claim 7, wherein a forming method of the low-temperature sealing layer comprises: forming the low-temperature sealing layer using a metal material by way of combining any one of a physical vapor deposition process, a chemical vapor deposition process, and an electroplating process with a low-temperature eutectic bonding process.

12. The preparation method according to claim 11, wherein the metal material is one or more of Cu, Sn, Pb, In, Au, Ag, and Sb.

* * * * *